(12) United States Patent
Braceras et al.

(10) Patent No.: US 8,611,164 B2
(45) Date of Patent: Dec. 17, 2013

(54) DEVICE AND METHOD FOR DETECTING RESISTIVE DEFECT

(75) Inventors: George Maria Braceras, Essex Junction, VT (US); Harold Pilo, Underhill, VT (US); George E. Rudgers, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 172 days.

(21) Appl. No.: 13/195,114

(22) Filed: Aug. 1, 2011

(65) Prior Publication Data

US 2013/0033948 A1 Feb. 7, 2013

(51) Int. Cl.
*G11C 29/00* (2006.01)
*G11C 7/12* (2006.01)

(52) U.S. Cl.
USPC .......................................... 365/201; 365/203

(58) Field of Classification Search
None
See application file for complete search history.

(56) References Cited

U.S. PATENT DOCUMENTS

| | | | |
|---|---|---|---|
| 5,255,230 A * | 10/1993 | Chan et al. | 365/201 |
| 5,317,532 A | 5/1994 | Ochii | |
| 5,424,990 A | 6/1995 | Ohsawa | |
| 5,428,576 A | 6/1995 | Furuyama | |
| 5,544,105 A | 8/1996 | Hirose et al. | |
| 6,307,796 B1 | 10/2001 | Okamura et al. | |
| 6,501,692 B1 | 12/2002 | Melanson et al. | |
| 6,643,804 B1 | 11/2003 | Aipperspach et al. | |
| 6,728,912 B2 | 4/2004 | Dawson et al. | |
| 6,950,355 B2 | 9/2005 | Battacharya et al. | |
| 7,298,659 B1 | 11/2007 | Kengeri et al. | |
| 7,304,895 B2 | 12/2007 | Joshi et al. | |
| 7,463,508 B2 | 12/2008 | De Gyvez et al. | |
| 7,594,148 B2 | 9/2009 | Do | |
| 7,791,969 B2 | 9/2010 | Yoshihara | |
| 2010/0054062 A1 * | 3/2010 | Kobatake | 365/201 |

* cited by examiner

*Primary Examiner* — Hoai V Ho
*Assistant Examiner* — James G Norman
(74) *Attorney, Agent, or Firm* — David A. Cain; Hoffman Warnick LLC

(57) ABSTRACT

The invention provides a device and method for detecting a resistive defect in a static random access memory (SRAM) device. A first aspect of the invention provides a static random access memory (SRAM) device comprising: a bitline; a wordline; a bitline precharge circuit electrically connected to the bitline and adapted to provide to the bitline a first precharge voltage for precharging the bitline during normal operation of the SRAM device and a second precharge voltage less than the first precharge voltage for testing the SRAM device for a resistive defect between the bitline and the wordline.

20 Claims, 5 Drawing Sheets

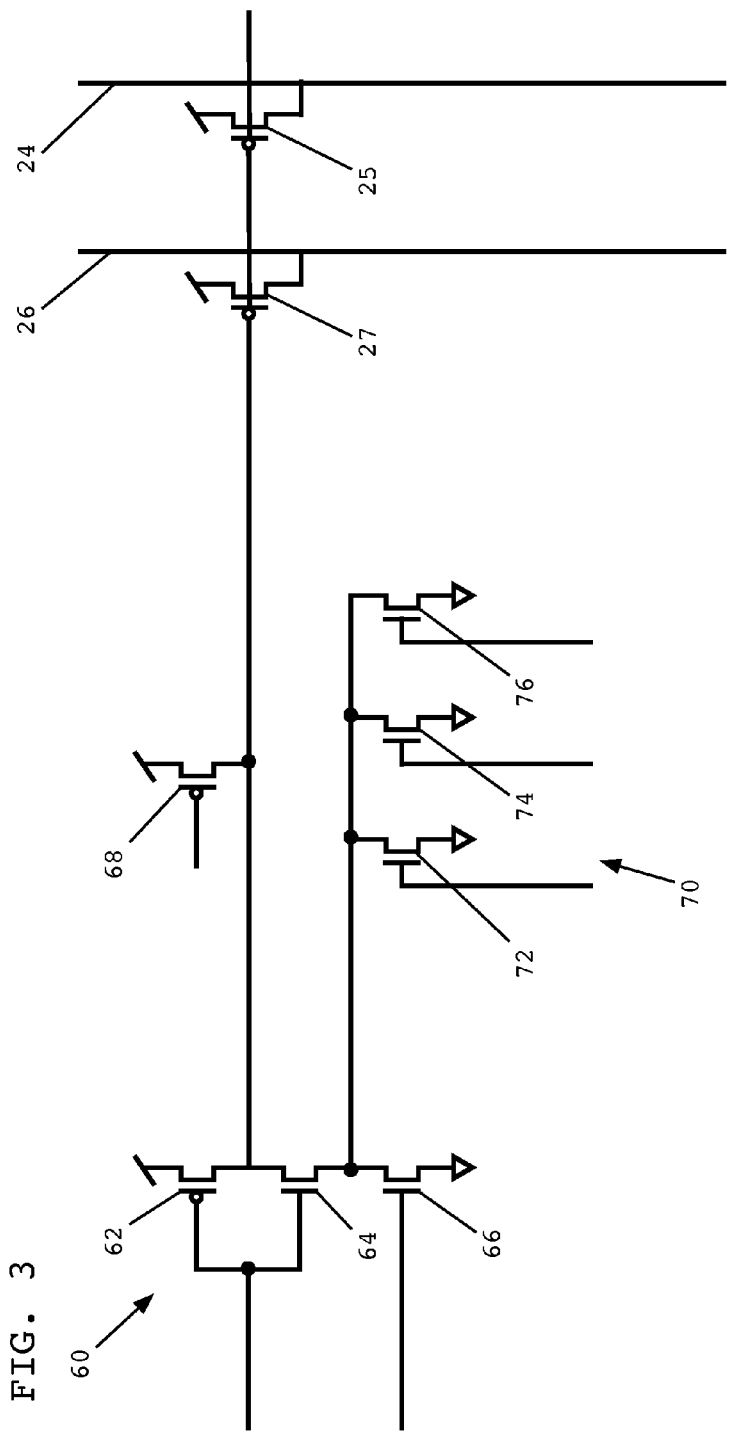

DEVICE AND METHOD FOR DETECTING RESISTIVE DEFECT

TECHNICAL FIELD

The present invention relates generally to the fabrication and testing of memory devices and, more particularly, to devices and methods for detecting resistive defects in memory devices.

BACKGROUND OF THE INVENTION

During the fabrication of high-performance static random access memory (SRAM) devices, resistive defects sometimes form. Often, these resistive defects form within a bitcell near the wordline and bitline transfer gate interconnection. In some cases, these resistive defects have an ohmic value that does not significantly affect device function and often is not detectable during normal test and finishing processes. However, during the lifetime of the SRAM device, these resistive defects can lead to bitline failure due to normal aging of bitline precharge circuits. Interestingly, bitline failures due to such resistive defects may not include failure of the bitcell(s) having the resistive defect. No devices or methods for detecting these resistive defects are known.

SUMMARY OF THE INVENTION

The invention provides a device and method for detecting a resistive defect in a static random access memory (SRAM) device.

A first aspect of the invention provides a static random access memory (SRAM) device comprising: a bitline; a wordline; a bitline precharge circuit electrically connected to the bitline and adapted to provide to the bitline a first precharge voltage for precharging the bitline during normal operation of the SRAM device and a second precharge voltage less than the first precharge voltage for testing the SRAM device for a resistive defect between the bitline and the wordline.

A second aspect of the invention provides a method of testing a static random access memory (SRAM) device for a resistive defect, the method comprising: activating a bitline precharge circuit electrically connected to a bitline of the SRAM device to deliver to the bitline a voltage insufficient to return the bitline to a drain voltage of the bitline precharge circuit; discontinuing delivery of the voltage to the bitline; determining whether the bitline experiences a read failure; and in the case that the bitline experiences a read failure, concluding that the bitline includes a resistive defect.

A third aspect of the invention provides an electronic circuit comprising: a precharge device including a plurality of precharge transistors; a plurality of test transistors electrically connected to the plurality of precharge transistors; at least one serial transistor electrically connected to the precharge device and at least one of the test transistors, wherein the at least one serial transistor may be activated to reduce a drain saturation current of the precharge device.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which:

FIG. 3 shows a wiring schematic of a bitline precharge circuit and resistive defect detection circuitry according to an embodiment of the invention.

FIG. 4 shows a logic schematic of the resistive defect detection circuitry of FIG. 3.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
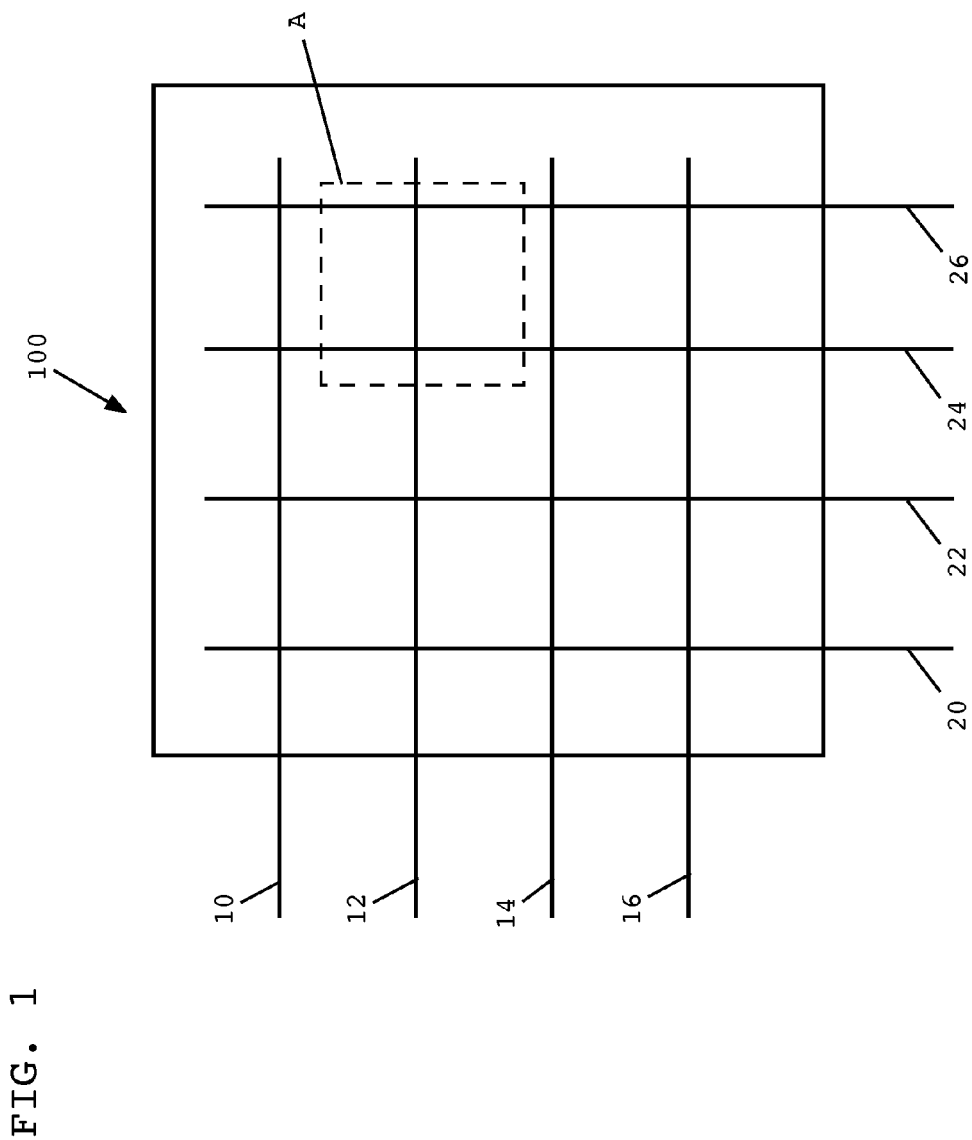
FIG. 1 shows a schematic view of a portion of a static random access memory (SRAM) device.

Turning now to the drawings, FIG. 1 shows a simplified schematic view of a portion of a static random access memory (SRAM) device 100 comprising a plurality of wordlines 10, 12, 14, 16 and bitlines 20, 22, 24, 26. A detailed view of area A is shown in the wiring schematic of FIG. 2.

Figure 2:
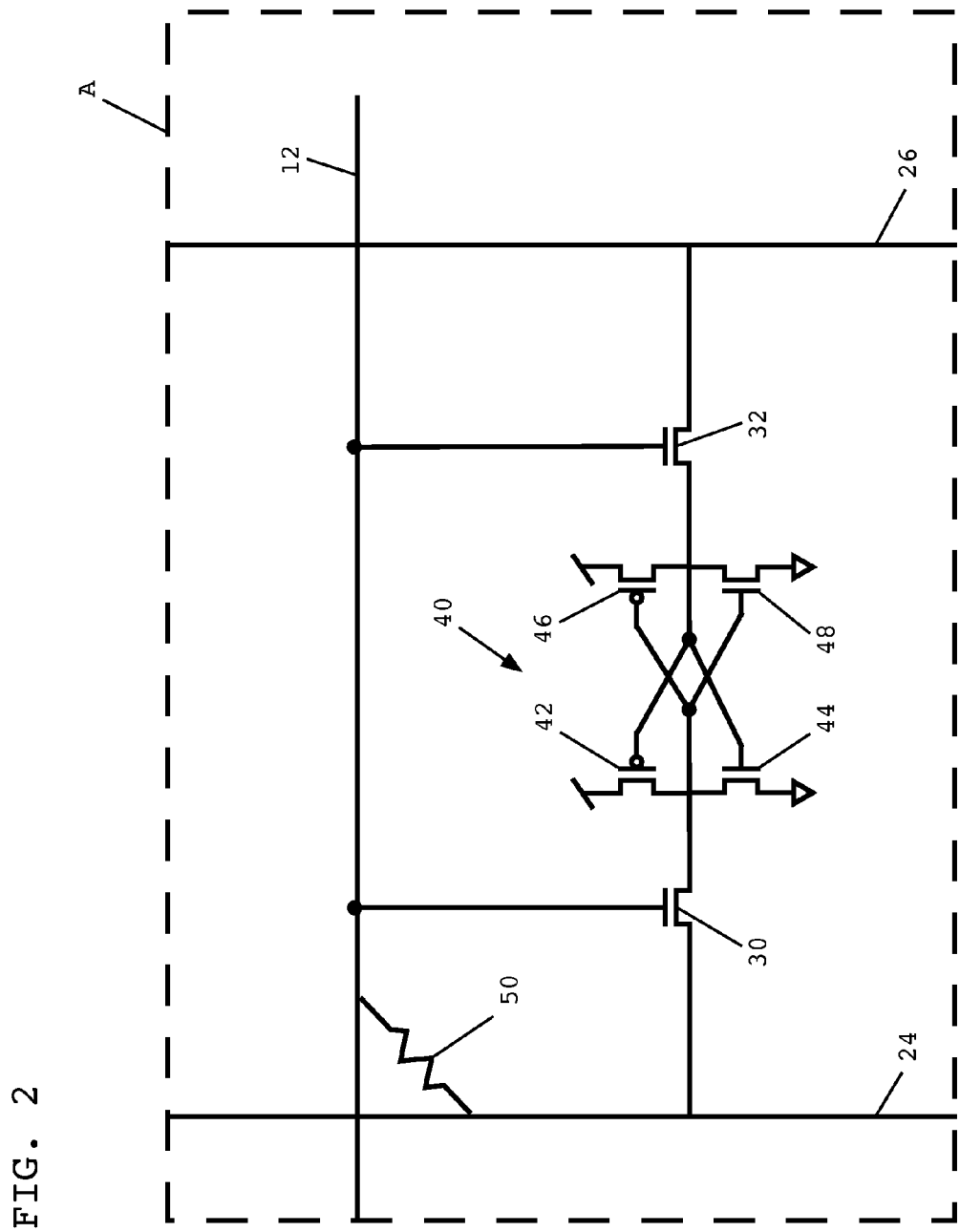
FIG. 2 shows a wiring schematic of a portion of the SRAM device of FIG. 1.

As can be seen in FIG. 2, bitcell 40 is located between bitline 24 and bitline 26. Bitcell 40 comprises cross-coupled inverters comprised of transistors 42, 44 and transistors 46, 48, which act as a storage element. Access transistors 30, 32 permit access to bitcell 40 via wordline 12. Other bitcell circuitry is possible, of course, that shown in FIG. 2 being merely for purposes of illustration. For example, in some SRAM devices, transistors 42 and 46 are replaced with resistors formed in undoped polysilicon.

In FIG. 2, in which a resistive defect 50 can be seen at the intersection of wordline 12 and bitline 24. The causes of individual resistive defects may vary or, in some cases, be unknown. One potential cause of such resistive defects is the presence of residual tantalum adjacent the wordline and/or bitline. Regardless of the cause, it has been found that resistive defects within a particular ohmic range do not have a significant negative impact on performance during the early life of the device but, as the device ages, bitline precharge circuitry (described below) degrades due to negative bias temperature instability (NBTI). This degradation results in a saturation current that is significantly lower at the end of the device's life than during its early life.

The range for such resistive defects, i.e., the ohmic range within which a resistive defect is tolerable during early life and not tolerable at end of life, is between about 50% and about 200% of the drain voltage ($V_{DD}$) divided by the drain saturation current ($I_{DSAT}$), as that value is represented in Equation 1.

$$R = (V_{DD}/I_{DSAT}) \quad \text{(Eq. 1)}$$

As the device ages and the drain saturation current of the precharge device decreases. This decreases the ability of the precharge device to operate the bitline and ultimately results in a read failure in all bitcells of the bitline, with the exception of the bitcell in which the resistive defect is located.

FIG. 3 shows a wiring schematic of a precharge device 60 and detection circuitry 70 for detecting resistive defects within an SRAM device. Precharge device 60 itself is typical and includes precharge transistors 62, 64, 25, 27 for precharging bitlines 24, 26 during normal operation of an SRAM device. However, the addition of test transistors 66 and 68 and detection circuitry 70, according to one embodiment of the invention, permits operation of the SRAM device under conditions approximating those experienced at end of life.

For example, during normal operation of an SRAM device, none of serial transistors 72, 74, 76 of detection circuitry 70 or test transistor 68 is active and precharge device 60 simply precharges bitlines 24, 26. However, activation of one of serial transistors 72, 74, 76 in conjunction with transistor 68 decreases the drain saturation current, thereby approximating the drain saturation current of a more aged SRAM device. Activating more than one serial transistor 72, 74, 76 decreases the drain saturation current further, approximating the drain saturation current of an even more aged SRAM device. When the drain saturation current has been decreased sufficiently, a read failure will be induced in all bitcells of the bitline except, in some cases, those bitcells having a resistive defect.

It should be noted that the inclusion of three serial transistors 72, 74, 76 in detection circuitry 70 is merely for the purpose of explanation. More or fewer serial transistors may be so employed within detection circuitry 70. The number and size of serial transistors employed should be such that the greatest decrease in drain saturation current achievable when all serial transistors are activated will sufficiently approximate the drain saturation current of the end-of-life of precharge transistors 25, 27 of the SRAM device. In most cases, the end-of-life drain saturation current of precharge transistors 25, 27 of an SRAM device is greater than half its initial drain saturation current. Accordingly, detection circuitry 70 capable of reducing the drain saturation current of precharge transistors 25, 27 of an SRAM device by 50% would be sufficient, in most cases, to approximate the end-of-life drain saturation current of precharge transistors 25, 27 of the SRAM device.

FIG. 4 shows a logic schematic of the detection circuitry of FIG. 3, in which one or more of serial transistors 72, 74, 76 may independently be activated, in conjunction with test transistor 68, to reduce the drain saturation current of the precharge device 60 (FIG. 3).

Figure 5:
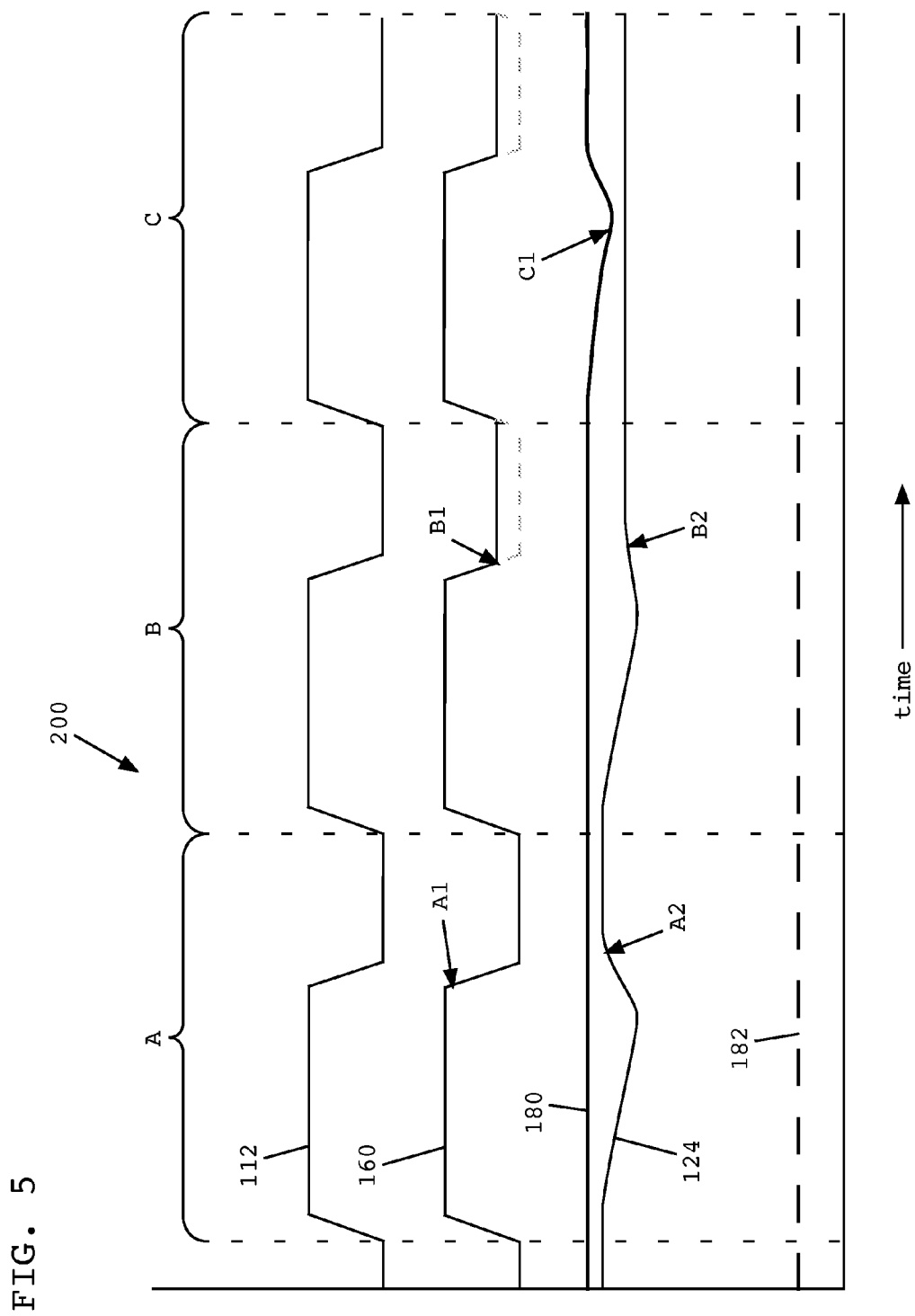
FIG. 5 shows voltage waveforms of SRAM device components during operation of the SRAM device according to an embodiment of the invention.

FIG. 5 shows voltage waveforms of components of an SRAM device having detection circuitry, such as that shown in FIG. 3, across three periods: A, B, and C. During period A, the SRAM device is operated normally. That is, detection circuitry is not employed during period A and bitline voltage 124 responds to activation of a bitline precharge device at A1 by returning to the drain voltage ($V_{DD}$) 180 at A2. Wordline voltage 112 and ground voltage 182 are shown across all three periods.

During period B, detection circuitry is activated at B1, resulting in a weaker bitline precharge device that is incapable of restoring bitline voltage 124 to $V_{DD}$, as can be seen at B2. The failure of bitline voltage 124 to return to $V_{DD}$ results in a read failure during period C, as can be seen at C1. As noted above, the read failure at C1 may be experienced in all bitcells of the bitline other than those bitcells having a resistive defect 50 (FIG. 2).

As described above with respect to FIG. 3, the activation of detection circuitry 70 may include activation of one or more of a plurality of transistors 72, 74, 76 of the detection circuitry 70. Thus, depending on the manner in which transistors or other components of the detection circuitry are connected, it is possible to reduce a voltage of the bitline precharge circuit 60 by varying degrees.

Figure 6:
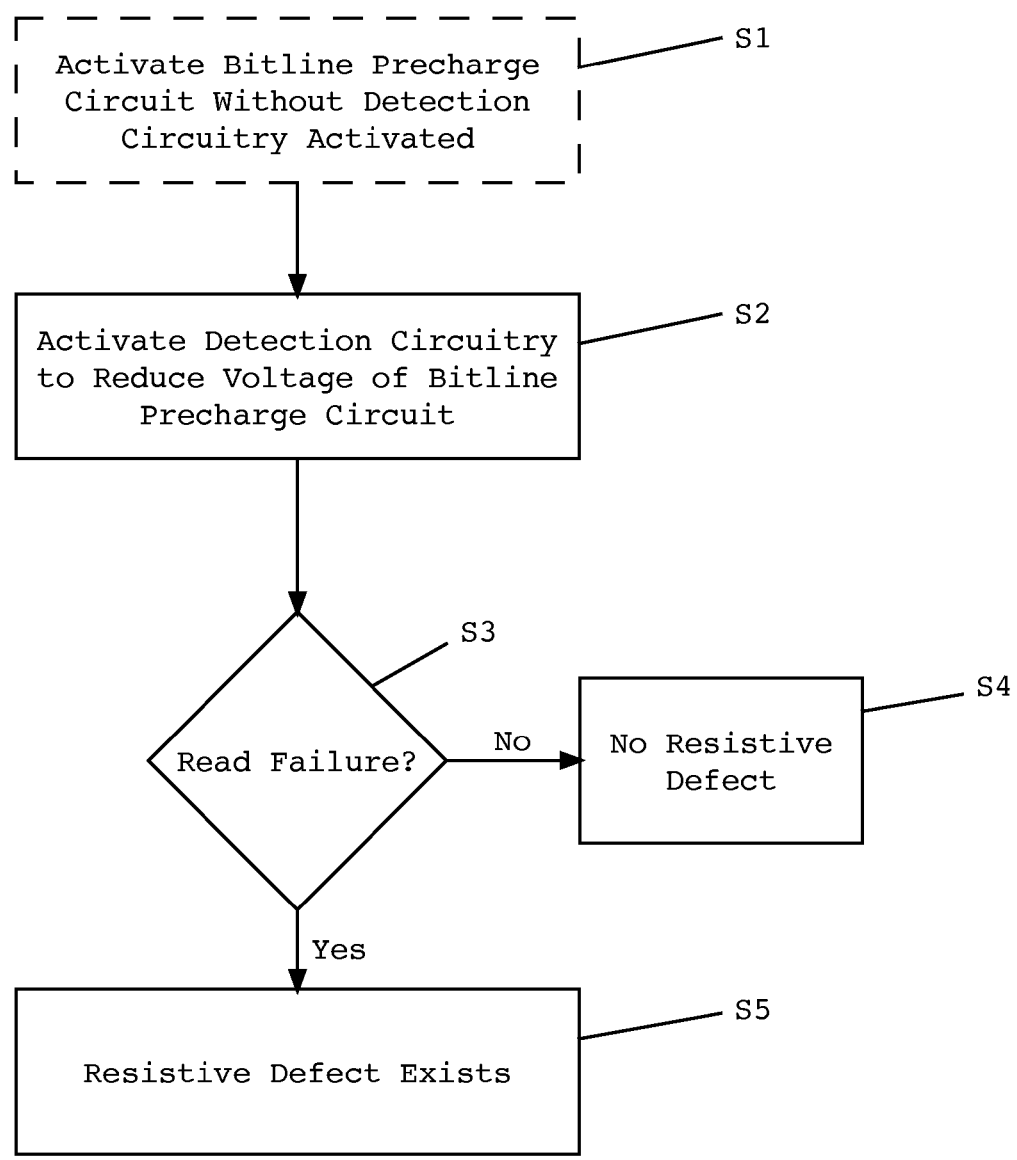
FIG. 6 shows a flow diagram of an illustrative method according to an embodiment of the invention.

It should be understood, then, that by employing detection circuitry such as that described above, it is possible, during testing of an SRAM device, to detect the presence of a resistive defect that would otherwise result in unacceptable read failures as the SRAM device ages. FIG. 6 shows a flow diagram of an illustrative method of testing for such a resistive defect. At S1, a bitline precharge circuit 60 (FIG. 3) may optionally be operated normally, i.e., without activation of detection circuitry 70 (FIG. 3). At S2, the detection circuitry 70 is activated, thereby reducing a voltage 160 (FIG. 4) of the bitline precharge circuit 60, such that the reduced voltage is incapable of restoring the bitline voltage 124 (FIG. 4) to $V_{DD}$ 180 (FIG. 4).

It is determined at S3 whether the bitline has experienced a read failure. If not, i.e., "No" at S3, it may be concluded at S4 that a resistive defect within the ohmic range described above does not exist in the bitline. If the bitline has experienced a read failure, i.e., "Yes" at S3, it may be concluded at S5 that a resistive defect does exist in the bitline.

As noted above, in the case of a read failure at S3, a bitcell containing the resistive defect may not experience the read failure. Accordingly, in some embodiments of the invention, it may be determined whether each bitcell in the bitline experienced the read failure and concluding that a bitcell not experiencing the read failure contains the resistive defect.

The terminology used herein is for the purpose of describing particular embodiments only and is not intended to be limiting of the disclosure. As used herein, the singular forms "a", "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A static random access memory (SRAM) device comprising:
    a bitline;
    a wordline;
    a bitline precharge circuit electrically connected to the bitline and adapted to provide to the bitline a first precharge voltage for precharging the bitline during normal operation of the SRAM device and a second precharge voltage less than the first precharge voltage for testing the SRAM device for a resistive defect between the bitline and the wordline.

2. The SRAM device of claim 1, wherein, upon providing to the bitline the second precharge voltage, the bitline fails to return to a drain voltage of the bitline precharge circuit.

3. The SRAM device of claim 2, wherein, upon providing to the bitline an additional second precharge voltage, the bitline exhibits a read failure, in the case that the resistive defect exists between the bitline and the wordline.

4. The SRAM device of claim 3, wherein the read failure is observed in all bitcells of the bitline, with the exception of a bitcell having the resistive defect.

5. The SRAM device of claim 1, wherein the bitline precharge circuit includes a plurality of transistors, at least one of which may be alternately activated and deactivated to alternate between the second precharge voltage and the first precharge voltage.

6. The SRAM device of claim 5, wherein the plurality of transistors includes at least three transistors, at least two of which may, independently, be alternately activated and deactivated to alternate among the second precharge voltage, the first precharge voltage, and a third precharge voltage less than the first precharge voltage and greater than the second precharge voltage.

7. The SRAM device of claim 1, wherein the bitline precharge circuit is capable of detecting a resistive defect having an ohmic value between about 50% and about 200% of a resistance value equal to a drain voltage of the bitline precharge circuit divided by a drain saturation current of the bitline precharge circuit.

8. A method of testing a static random access memory (SRAM) device for a resistive defect, the method comprising:
   activating a bitline precharge circuit electrically connected to a bitline of the SRAM device by delivering to the bitline a voltage insufficient to return the bitline to a drain voltage of the bitline precharge circuit;
   determining whether the bitline experiences a read failure; and
   in the case that the bitline experiences a read failure, concluding that the bitline includes a resistive defect between the bitline and a wordline of the SRAM device,
   wherein the voltage insufficient to return the bitline to a drain voltage is less than a voltage sufficient to precharge the bitline.

9. The method of claim 8, wherein the concluding includes concluding that the resistive defect has an ohmic value between about 50% and about 200% of a resistance value equal to a drain voltage of the bitline precharge circuit divided by a drain saturation current of the bitline precharge circuit.

10. The method of claim 8, wherein the determining includes determining whether each bitcell in the bitline experiences the read failure.

11. The method of claim 10, wherein, in the case that at least one bitcell in the bitline does not experience the read failure, concluding that the at least one bitcell not experiencing the read failure contains the resistive defect.

12. The method of claim 8, wherein the activating includes activating at least one transistor of the bitline precharge circuit to reduce a voltage of the bitline precharge circuit to the voltage insufficient to return the bitline to the drain voltage of the bitline precharge circuit.

13. The method of claim 12, wherein the activating at least one transistor includes activating at least two of a plurality of transistors of the bitline precharge circuit.

14. An electronic circuit comprising:
   a precharge device including a plurality of precharge transistors;
   a plurality of test transistors electrically connected to the plurality of precharge transistors;
   at least one serial transistor electrically connected to the precharge device and at least one of the test transistors, wherein the at least one serial transistor may be activated to reduce a drain saturation current of the precharge device.

15. The electronic circuit of claim 14, wherein the at least one serial transistor includes a plurality of serial transistors connected in series.

16. The electronic circuit of claim 15, wherein the plurality of serial transistors includes at least three serial transistors connected in series.

17. The electronic circuit of claim 16, wherein activation of one of the serial transistors is operable to reduce the drain saturation current to a first reduced current less than an unreduced drain saturation current, activation of two of the serial transistors is operable to reduce the drain saturation current to a second reduced current less than the first reduced current, and activation of three of the serial transistors is operable to reduce the drain saturation current to a third reduced current less than the second reduced current.

18. The electronic circuit of claim 17, wherein the third reduced current is greater than about 50% of the unreduced drain saturation current.

19. The electronic circuit of claim 14, wherein the precharge device is electrically connected to a bitline of a static random access memory (SRAM) device.

20. The electronic circuit of claim 19, wherein the reduced drain saturation current of the precharge device is operable to deliver to the bitline a voltage insufficient to return the bitline to a drain voltage of the precharge device.

* * * * *